US010411733B2

United States Patent
Pennala et al.

(10) Patent No.: US 10,411,733 B2
(45) Date of Patent: Sep. 10, 2019

(54) DATA COMPRESSION AND DECOMPRESSION

(71) Applicant: ARM LIMITED, Cambridge (GB)

(72) Inventors: Jussi Tuomas Pennala, Trondheim (NO); Noelia Rodriguez Matilla, Lund (SE)

(73) Assignee: ARM Limited, Cambridge (GB)

( * ) Notice: Subject to any disclaimer, the term of this patent is extended or adjusted under 35 U.S.C. 154(b) by 27 days.

(21) Appl. No.: 15/794,272

(22) Filed: Oct. 26, 2017

(65) Prior Publication Data

US 2019/0132002 A1    May 2, 2019

(51) Int. Cl.
 *H03M 7/30* (2006.01)

(52) U.S. Cl.
 CPC ....... *H03M 7/6047* (2013.01); *H03M 7/6005* (2013.01); *H03M 7/6011* (2013.01)

(58) Field of Classification Search
 CPC . H03M 7/6047; H03M 7/6011; H03M 7/6005
 USPC .................................................... 341/87, 107
 See application file for complete search history.

(56) References Cited

U.S. PATENT DOCUMENTS

| 8,488,893 | B2 * | 7/2013 | Itoh | H04N 19/59 |
| | | | | 382/232 |
| 10,171,825 | B1 * | 1/2019 | Jean | H04N 19/436 |
| 10,171,839 | B2 * | 1/2019 | Cai | H04N 19/12 |
| 10,178,391 | B2 * | 1/2019 | Yu | H04N 19/197 |

* cited by examiner

*Primary Examiner* — Brian K Young
(74) *Attorney, Agent, or Firm* — Nixon & Vanderye P.C.

(57) ABSTRACT

Apparatus comprises data compression circuitry to process a set of data values, the data compression circuitry comprising: detector circuitry to detect, for each of n complementary groups of m data values of the set of data values, a first subset of the groups for which the data values in the group have a predetermined pattern of data values, where m and n are integers and m×n is the number of data values in the set of data values; generator circuitry to generate a compressed data packet comprising at least: a representation of a second subset of the groups, the second subset being each of the n complementary groups other than groups in the first subset; and an indication of a group position, with respect to the set of data values, of each group in the second subset of groups. Complementary decompression apparatus is also described.

19 Claims, 11 Drawing Sheets

BLOCK 512b:
0x000000000b83f3c1000000000b83e3c1000000000b83d3c1000000000b83c3c100
0000000b83b3c1000000000b83a3c1000000000b8390c1000000000b8380c1 } 300

BLOCK 32x16b:

| 00000000000000000000000000000000 | (0x0) |
| 00001011100000111111001111000001 | (0x0b83f3c1) |
| 00000000000000000000000000000000 | (0x0) |
| 00001011100000111110001111000001 | (0x0b83e3c1) |
| 00000000000000000000000000000000 | (0x0) |
| 00001011100000111101001111000001 | (0x0b83d3c1) |
| 00000000000000000000000000000000 | (0x0) |
| 00001011100000111100001111000001 | (0x0b83c3c1) |
| 00000000000000000000000000000000 | (0x0) |
| 00001011100000111011001111000001 | (0x0b83b3c1) |
| 00000000000000000000000000000000 | (0x0) |
| 00001011100000111010001111000001 | (0x0b83a3c1) |
| 00000000000000000000000000000000 | (0x0) |
| 00001011100000111001000011000001 | (0x0b8390c1) |
| 00000000000000000000000000000000 | (0x0) |
| 00001011100000111000000011000001 | (0x0b8380c1) |

BLOCK 512b:

0000fffd0000fefe0000fdfc0000fbf90000fafa0000f9f80000f7f50000f6f60000
f5f40000f3f10000f2f20000f1f00000efed0000eeee0000edec0000ebe9 } 500

BLOCK 16x32b: 510  520

0000000000000000 1111101111111001 (0x0000 0xfbf9) (rows 31 & 30)
0000000000000000 1111111011111110 (0x0000 0xfefe)
0000000000000000 1111101111111001 (0x0000 0xfbf9)
0000000000000000 1111101111111001 (0x0000 0xfbf9)
0000000000000000 1111101011111010 (0x0000 0xfafa)
0000000000000000 1111101111111001 (0x0000 0xfbf9)
0000000000000000 1111011111110101 (0x0000 0xf7f5)
0000000000000000 1111011011110110 (0x0000 0xf6f6)
0000000000000000 1111101111111001 (0x0000 0xfbf9)
0000000000000000 1111001111110001 (0x0000 0xf3f1)
0000000000000000 1111101111111001 (0x0000 0xfbf9)
0000000000000000 1111000111110000 (0x0000 0xf1f0)
0000000000000000 1110111111101101 (0x0000 0xefed)
0000000000000000 1110111011101110 (0x0000 0xeeee)
0000000000000000 1110110111101100 (0x0000 0xedec)
0000000000000000 1110101111101001 (0x0000 0xebe9) (rows 1 & 0)

(0xfbf9 << 30)
| (0xfefe << 28)
| (0xfbf9 << 26)
| (0xfbf9 << 24)
| (0xfafa << 22)
| (0xfbf9 << 20)
| (0xf7f5 << 18)
| (0xf6f6 << 16)
| (0xfbf9 << 14)
| (0xf3f1 << 12)
| (0xfbf9 << 10)
| (0xf1f0 <<  8)
| (0xefed <<  6)
| (0xeeee <<  4)
| (0xedec <<  2)
| (0xebe9 <<  0)

FIG. 6

BLOCK:
ff93ffa4ff92ffa3ff8dff9eff8eff9fff91ffa2ff90ffa1ff8bff9bff8cff9cff87 } 800
ff97ff86ff96ff81ff90ff82ff91ff89ff99ff88ff98ff83ff92ff84ff93

If we look at the block as 16 lines of 32 bit patterns, it appears as

BLOCK 32x16b:

| ORIGINAL FRAME 32x16 |
|---|
| 1 1 1 1 1 1 1 1 0 0 1 0 0 1 1 1 1 1 1 1 1 1 1 0 1 0 0 1 0 0 |
| 1 1 1 1 1 1 1 1 0 0 1 0 0 1 0 1 1 1 1 1 1 1 1 0 1 0 0 0 1 1 |
| 1 1 1 1 1 1 1 1 0 0 0 1 1 0 1 1 1 1 1 1 1 1 1 0 0 1 1 1 1 0 |
| 1 1 1 1 1 1 1 1 0 0 0 1 1 1 0 1 1 1 1 1 1 1 1 0 0 1 1 1 1 1 |
| 1 1 1 1 1 1 1 1 0 0 1 0 0 0 1 1 1 1 1 1 1 1 1 0 1 0 0 0 1 0 |
| 1 1 1 1 1 1 1 1 0 0 1 0 0 0 0 1 1 1 1 1 1 1 1 0 1 0 0 0 0 1 |
| 1 1 1 1 1 1 1 1 0 0 1 0 1 1 1 1 1 1 1 1 1 1 1 0 0 1 1 0 1 1 |
| 1 1 1 1 1 1 1 1 0 0 1 1 0 0 1 1 1 1 1 1 1 1 1 0 0 1 1 1 0 0 |
| 1 1 1 1 1 1 1 1 0 0 0 1 1 1 1 1 1 1 1 1 1 1 1 0 0 1 0 1 1 1 |
| 1 1 1 1 1 1 1 1 0 0 0 1 1 0 1 1 1 1 1 1 1 1 1 0 0 1 0 1 1 0 |
| 1 1 1 1 1 1 1 1 0 0 0 0 0 1 1 1 1 1 1 1 1 1 1 0 1 0 0 0 0 0 |
| 1 1 1 1 1 1 1 1 0 0 0 0 1 0 1 1 1 1 1 1 1 1 1 0 1 0 0 0 0 1 |
| 1 1 1 1 1 1 1 1 0 0 1 0 0 1 0 1 1 1 1 1 1 1 1 0 1 1 0 0 0 1 |
| 1 1 1 1 1 1 1 1 0 0 1 0 0 0 1 1 1 1 1 1 1 1 1 0 0 1 1 0 0 0 |
| 1 1 1 1 1 1 1 1 0 0 0 0 1 1 1 1 1 1 1 1 1 1 1 0 0 1 0 0 1 0 |
| 1 1 1 1 1 1 1 1 0 0 0 0 1 0 0 1 1 1 1 1 1 1 1 0 0 1 0 0 1 1 |

BLOCK 512b:
0x861a0c7ca72aa72aa72aa72aa72aa72acb3c064ca72aa72aa72aa72aa72a76
1a974aa72aa72aa72aa72aa72aa72af8ce7f2ea72aa72aa72aa72aa72aa72a

BLOCK 32x16b:
```
10000110000110100000110001111100 (0x861a0c7c)
10100111001010101010011100101010 (0xa72aa72a)
10100111001010101010011100101010 (0xa72aa72a)
10100111001010101010011100101010 (0xa72aa72a)
11001011001111000000110010011100 (0xcb3c064c)
10100111001010101010011100101010 (0xa72aa72a)
10100111001010101010011100101010 (0xa72aa72a)
10100111001010101010011100101010 (0xa72aa72a)
01110110000110101001011101001010 (0x761a974a)
10100111001010101010011100101010 (0xa72aa72a)
10100111001010101010011100101010 (0xa72aa72a)
10100111001010101010011100101010 (0xa72aa72a)
11111000110011100111111100101110 (0xf8ce7f2e)
10100111001010101010011100101010 (0xa72aa72a)
10100111001010101010011100101010 (0xa72aa72a)
10100111001010101010011100101010 (0xa72aa72a)
```
— 1180

{key, data} =
{ 0xa72aa72a
  (0x2130ab56 << 15)
| (0x6c16a166 << 11)
| (0xd1303060 <<  7)
| (0x5fe4d804 <<  3) }

FIG. 11c

1400
- RL32x16: 32x16 block with row compression without key
- RX32x16: 32x16 block with row compression with key
- CL32x16: 32x16 block with column compression without key
- CX32x16: 32x16 block with column compression with key
- RL16x32: 16x32 block with row compression without key
- RX16x32: 16x32 block with row compression with key
- CL16x32: 16x32 block with column compression without key
- CX16x32: 16x32 block with column compression with key

DATA COMPRESSION AND DECOMPRESSION

BACKGROUND

This disclosure relates to data compression and decompression.

By way of example, some data transfers, for example between graphics processing units (GPUs) and memory systems, involve transferring data blocks of a block size such as 512 bits (64 bytes). Depending on a bus width applicable to the transfer of a data block, it can require several individual transfers or "beats", each of a part of the data block, to transfer the whole block. In the context of processing operations such as the use of a GPU, the resources required for the transfer of such data blocks can be a limiting factor on the performance of the overall system and in some circumstances can lead to undesired power consumption.

SUMMARY

In an example arrangement there is provided apparatus comprising:
data compression circuitry to process a set of data values, the data compression circuitry comprising:
detector circuitry to detect, for each of n complementary groups of m data values of the set of data values, a first subset of the groups for which the data values in the group have a predetermined pattern of data values, where m and n are integers and m×n is the number of data values in the set of data values;
generator circuitry to generate a compressed data packet comprising at least:
a representation of a second subset of the groups, the second subset being each of the n complementary groups other than groups in the first subset; and
an indication of a group position, with respect to the set of data values, of each group in the second subset of groups.

In another example arrangement there is provided data processing apparatus comprising:
a first processing node;
a second processing node;
a data interconnection between the first processing node and the second processing node; and
data compression circuitry to compress a set of data values to be transmitted via the data interconnection from the first processing node to the second processing node, the data compression circuitry comprising:
detector circuitry to detect, for each of n complementary groups of m data values of the set of data values, a first subset of the groups for which the data values in the group have a predetermined pattern of data values, where m and n are integers and m×n is the number of data values in the set of data values; and
generator circuitry to generate a compressed data packet comprising at least:
a representation of a second subset of the groups, the second subset being each of the n complementary groups other than groups in the first subset; and
an indication of a group position, with respect to the set of data values, of each group in the second subset of groups.

In another example arrangement there is provided apparatus comprising:
data decompression circuitry to process a compressed data packet to generate a set of output data values, the compressed data packet comprising at least a representation of a subset of n complementary groups of m data values of a set of output data values, and an indication of a group position, with respect to the set of output data values, of each group in the subset of groups;
the data decompression circuitry being configured to assemble the set of output data values by inserting the subset of groups at their respective group positions and setting other groups of data values of the set of output data values to a predetermined pattern of data values.

In another example arrangement there is provided a data compression method comprising:
detecting, for each of n complementary groups of m data values of the set of data values, a first subset of the groups for which all of the data values in the group have a predetermined pattern of data values, where m and n are integers and m×n is the number of data values in the set of data values; and
generating a compressed data packet comprising at least:
a representation of a second subset of the groups, the second subset being each of the n complementary groups other than groups in the first subset; and
an indication of a group position, with respect to the set of data values, of each group in the second subset of groups.

In another example arrangement there is provided a data decompression method comprising:
processing a compressed data packet to generate a set of output data values, the compressed data packet comprising at least a representation of a subset of n complementary groups of m data values of a set of output data values, and an indication of a group position, with respect to the set of output data values, of each group in the subset of groups;
assembling the set of output data values by inserting the subset of groups at their respective group positions and setting other groups of data values to a predetermined pattern of data values.

Further respective aspects and features of the present technology are defined by the appended claims.

BRIEF DESCRIPTION OF THE DRAWINGS

The present technique will be described further, by way of example only, with reference to embodiments thereof as illustrated in the accompanying drawings, in which:

FIG. 3 schematically illustrates a data block;

FIG. 4 schematically illustrates a compressed version of the data block of FIG. 3;

FIG. 5 schematically illustrates a data block;

FIG. 6 schematically illustrates a compressed version of the data block of FIG. 5;

FIG. 7a schematically illustrates a data block after applying an XOR operation with a data pattern;

FIG. 7b schematically illustrates a compressed version of the data block of FIG. 7a;

FIG. 8 schematically illustrates a data block;

FIGS. 11a to 11c schematically illustrate a further compression example;

DESCRIPTION OF EMBODIMENTS

Figure 1:
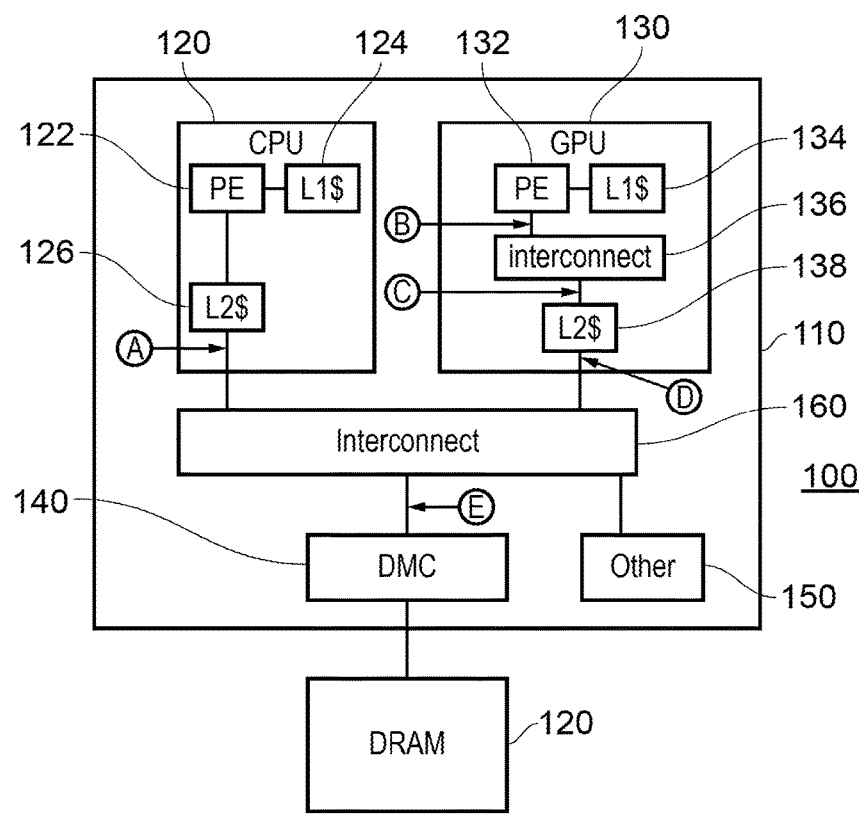
FIG. 1 schematically illustrates a data processing apparatus.

Before discussing the embodiments with reference to the accompanying figures, the following description of embodiments is provided.

An example embodiment provides apparatus comprising:
data compression circuitry to process a set of data values, the data compression circuitry comprising:
detector circuitry to detect, for each of n complementary groups of m data values of the set of data values, a first subset of the groups for which the data values in the group have a predetermined pattern of data values, where m and n are integers and m×n is the number of data values in the set of data values;
generator circuitry to generate a compressed data packet comprising at least:
a representation of a second subset of the groups, the second subset being each of the n complementary groups other than groups in the first subset; and
an indication of a group position, with respect to the set of data values, of each group in the second subset of groups.

As discussed above, it would be desirable to improve the efficiency of the transfer of data blocks (or sets of data values). Data compression (at a sending node) and decompression (at a receiving node) could provide a solution to this.

Previously proposed data compression and decompression techniques can potentially suffer from two main disadvantages: a first is that they can require a complex encoder and decoder design, potentially adding latency, power consumption and area (in the case of an integrated circuit implementation); and a second is that they can require prior information about the nature or type of the information being transferred.

The present disclosure concerns a technique which is potentially capable of compressing data blocks or sets of data values for transfer. The disclosure recognises the following features of data transfers in the context of processing units transferring to and from memory, for example. These are that data blocks may contain fixed or predetermined patterns, for example because unused parts of such data blocks may be padded with zeros or ones; and such data blocks may contain repeated similar patterns of (for example) 16, 32 or 64 bits, corresponding to the typical and native data widths of contemporary processing units at the time of filing.

In the present disclosure, a data block is considered as a number of complementary groups of data values. Some of these may contain a predetermined pattern of data values, in which case they are not transmitted. Instead, they can be reconstructed at the receiver side by inserting the predetermined pattern of data values. Other groups are transmitted, at least in the form of a representation of those groups, along with an indication of the location or position, in the data block, of each such group.

By avoiding the transmission of any groups with the predetermined pattern, a saving in data quantity, latency, power consumption or the like can potentially be achieved. This can reduce (for example) the number of data beats needed to transmit the compressed version of the data block, compared to the raw (original, uncompressed) data block.

In various examples, column-based encoding works efficiently on input data that has high correlation (similarity) in different every nth data value. Row-based encoding works efficiently on input data that has recurring pattern (zeros or other pattern) in different m contiguous data values. Varying the m×n selection enables the compression to work efficiently for different native data sizes (8-bit, 16-bit, 32-bit, . . . ) without the compression or decompression arrangements needing to know anything about the nature of the data (floating point, fixed point, integer or the like).

The predetermined pattern can be any pattern recognisable at the compression side and which can be reconstructed at the decompression side, such as 10101010101 . . . . However, in example arrangements, the predetermined pattern comprises all data values in the group having a predetermined data value such as 0. This can be particularly useful in situations where portions of the data block may be padded with zeros.

In order to apply the compression technique only when it leads to an advantage in terms of data quantity, example arrangements provide output circuitry to output either the set of data values (the raw data) or the compressed data packet, in dependence upon which of the set of data values and the compressed data packet represents a smaller amount of data.

The division of the original data block or set of data values into groups can be carried out such that the groups of data values comprise groups of m contiguous data values of the set of data values; or groups of every nth data value of the set of data values. The data block can be envisaged as being rearranged into a rectangular array of values, populated in a raster pattern from one corner of the array. In such an example, the first of these group types could represent rows within the array, and the second group type could represent columns within the array. However, note that this is a visualisation to assist in understanding rather than necessarily representing a physical or logical feature of the apparatus.

In order to potentially increase the number of such groups which have the predetermined pattern, in some examples in which the data values comprise respective data bits, the data compression circuitry can comprise combiner circuitry to combine each group of m data values with bits of an k-bit key group applied contiguously to the set of data values to generate a respective combined group, the detector circuitry operating with respect to the combined groups. This can reduce the varying content, so leading to a potentially greater number of columns or rows containing the predetermined value in the input data. The combination can be selected from the list consisting of: (i) a bitwise exclusive-OR combination to each group of m data values and bits of the k-bit key group; and (ii) an arithmetic combination of each group of m data values and bits of the k-bit key group.

In either case, the combination can be applied at the compression side and reversed at the decompression side. To assist in such reversal, in example arrangements the compressed data packet includes a representation of the k-bit key group. The combiner circuitry at the compression side may be configured to generate the k-bit key group, for example by setting each bit position of the coding value to one when at least a threshold proportion of instances (such as all instances) of the m-bit groups have a one at that bit position. For example, k could equal m, 2 m, 0.5 m, or another value whether or not an integer multiple or sub-multiple of m.

The apparatus can test multiple candidate compressions and select the best outcome (which could be the raw data as discussed above). For example, two or more instances of data compression circuitry may be provided to perform data compression to generate respective compressed data packets using:
 groups of m contiguous data values of the set of data values (rows, in the visualisation discussed above); and
 groups of every nth data value of the set of data values (columns in the visualisation discussed above);
 in which:
 the output circuitry is configured to output either the set of data values or one of the compressed data packets, in dependence upon which of the set of data values and the compressed data packets represents a smaller amount of data.

In other examples, the row and/or column size can be varied, given that the compression apparatus does not have prior knowledge about the data widths or padding of the data block. For example, the apparatus may comprise at least four instances of data compression circuitry, to perform data compression to generate respective compressed data packets using:
 (i) groups of m contiguous data values of the set of data values for a first value of m;
 (ii) groups of every nth data value of the set of data values for a first value of n;
 (iii) groups of m contiguous data values of the set of data values for a second value of m; and
 (iv) groups of every nth data value of the set of data values for a second value of n.

Again, the output circuitry can select the most appropriate form of the data as discussed above.

In some examples, the first value of m is equal to the second value of n; and the second value of m is equal to the first value of n. Examples are m=16, 32 and n=32, 16. But other examples, such as (64, 8), (8, 64) in the example context of a 512 bit data block can be used. It will be appreciated that other data block sizes such as 1024 bits may be used.

To assist in decompression, in example arrangements each compressed data packet includes format data indicating the groups used in the generation of that data packet and whether the first or second values of m and n were used.

Another example embodiment provides data processing apparatus comprising:
 a first processing node (such as a processing element);
 a second processing node (such as a data memory);
 a data interconnection between the first processing node and the second processing node; and
 data compression circuitry to compress a set of data values to be transmitted via the data interconnection from the first processing node to the second processing node, the data compression circuitry comprising:
 detector circuitry to detect, for each of n complementary groups of m data values of the set of data values, a first subset of the groups for which the data values in the group have a predetermined pattern of data values, where m and n are integers and m×n is the number of data values in the set of data values; and
 generator circuitry to generate a compressed data packet comprising at least:
 a representation of a second subset of the groups, the second subset being each of the n complementary groups other than groups in the first subset; and
 an indication of a group position, with respect to the set of data values, of each group in the second subset of groups.

Compression techniques as discussed above can be used to compress data for transmission from the first processing node to the second. The data can be handled (for example, stored) at the second processing node in its compressed form, or in other examples, the data processing apparatus can comprise data decompression circuitry to process a compressed data packet received via the data interconnection from the first processing node and to generate a set of output data values to be provided to the second processing node, the compressed data packet comprising at least a representation of a subset of n complementary groups of m data values of a set of output data values, and an indication of a group position, with respect to the set of output data values, of each group in the subset of groups;
 the data decompression circuitry being configured to assemble the set of output data values by inserting the subset of groups at their respective group positions and setting other groups of data values of the set of output data values to the predetermined pattern of data values.

Another example embodiment provides apparatus comprising:
 data decompression circuitry to process a compressed data packet to generate a set of output data values, the compressed data packet comprising at least a representation of a subset of n complementary groups of m data values of a set of output data values, and an indication of a group position, with respect to the set of output data values, of each group in the subset of groups;
 the data decompression circuitry being configured to assemble the set of output data values by inserting the subset of groups at their respective group positions and setting other groups of data values of the set of output data values to a predetermined pattern of data values.

This arrangement provides a decompression apparatus complementary to the compression apparatus discussed above.

In some examples, to assist in decompression, the compressed data packet has associated format data defining a compression format indicating at least whether the groups of m data values each comprise:
 groups of m contiguous data values of the set of data values; or
 groups of every nth data value of the set of data values; and
 the apparatus comprising a data store to store the format data associated with a received compressed data packet.

The stored format data can be used to assist in subsequent recompression of the same data, given that the compression format may already have been chosen by trial compression using various parameters and then selecting the best set of parameters. To achieve this, the apparatus may comprise data compression circuitry to process a set of data values, the data compression circuitry comprising:

detector circuitry to detect, for each of n complementary groups of m data values of the set of data values, a first subset of the groups for which all of the data values in the group have a predetermined pattern of data values, where m and n are integers and m×n is the number of data values in the set of data values;

generator circuitry to generate a compressed data packet comprising at least:

a representation of a second subset of the groups, the second subset being each of the n complementary groups other than groups in the first subset; and an indication of a group position, with respect to the set of data values, of each group in the second subset of groups;

in which, when the set of data values has been previously decompressed by the apparatus, the detector circuitry is configured to operate with respect to groups of m data values defined by the format data held by the data store in respect of the previous decompression of that set of data values.

Another example embodiment provides a data compression method comprising:

detecting, for each of n complementary groups of m data values of the set of data values, a first subset of the groups for which all of the data values in the group have a predetermined pattern of data values, where m and n are integers and m×n is the number of data values in the set of data values; and generating a compressed data packet comprising at least:

a representation of a second subset of the groups, the second subset being each of the n complementary groups other than groups in the first subset; and an indication of a group position, with respect to the set of data values, of each group in the second subset of groups.

Another example embodiment provides a data decompression method comprising:

processing a compressed data packet to generate a set of output data values, the compressed data packet comprising at least a representation of a subset of n complementary groups of m data values of a set of output data values, and an indication of a group position, with respect to the set of output data values, of each group in the subset of groups;

assembling the set of output data values by inserting the subset of groups at their respective group positions and setting other groups of data values to a predetermined pattern of data values.

FIG. 1 schematically illustrates a data processing apparatus 100 comprising an integrated circuit device 110 such as a so-called system on chip (SoC) and an external memory or DRAM (dynamic random access memory) 120.

The circuit 100 comprises various processing nodes such as a central processing unit (CPU) 120 having a processing element (PE) 122, a level 1 cache 124 and a level 2 cache 126; a graphics processing unit (GPU) 130 having a processing element 132, a level 1 cache 134, an interconnect 136, and a level 2 cache 138 linked to the processing element 132 via the interconnect 136; a memory controller (DMC) 140 and one or more other processing nodes 150. The processing nodes 120, 130, 140, 150 are interconnected by an interconnect 160.

The memory controller 140 provides an interface with the external memory 120.

In operation, data can be transferred between the processing elements 122, 132 and their respective caches 124, 126, 134, 138 and between the level 2 caches 126, 138 and external memory. In all of these instances, the data communication traffic can be considerable, particularly (though not exclusively) in the case of data handled by the GPU 130. This can place processing burdens on the interconnect 136 and the interconnect 160 for example.

To alleviate this potential problem, data compression and decompression arrangements can be provided. In FIG. 1, five locations, denoted by indicators A, B, C, D and E are potential locations for data compression and/or decompression circuitry.

Figure 2:
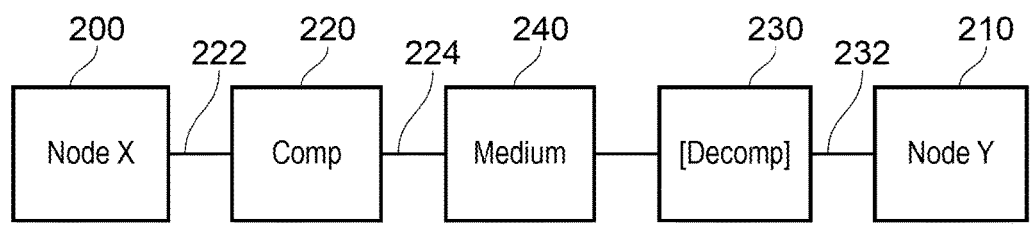
FIG. 2 schematically illustrates data compression and decompression in the apparatus of FIG. 1.

To explain the use of such compression and decompression circuitry, FIG. 2 schematically illustrates data compression and decompression in the context of the apparatus of FIG. 1. Here, a processing node (node X) 200 communicates data to a second processing node (node Y) 210 via a data communication path. The data communication path includes a compression apparatus 220 which acts with respect to the uncompressed data 222 provided by node X 200 and generates compressed data 224 for transmission to node Y.

A complimentary decompression apparatus 230 acts on the compressed data 234 to regenerate decompressed data 232 to be supplied to node Y. So, in the context of data communications via a transmission or storage medium (for example, a transmission path) 240 between the compression apparatus 220 and the decompression apparatus 230, which medium can include the interconnect 136 or the interconnect 160, compressed data is transmitted. In some examples, the medium 240 has a limited bandwidth such as 64 bits per cycle and may consume power in handling the data 224, both of which problems can be alleviated by using the present compression techniques. Depending upon the compression technique used, this can potentially be a smaller data quantity then would be the case if uncompressed data were handled by that data communication path. In turn, this can potentially lessen the processing or data communication load for handling such data.

Referring back to FIG. 1, the data transmitting node, node X 200, could be, for example, the level 2 cache 126 and the data receiving node, node Y, could be the memory controller 140. However, for data communication in the other direction (for example, populating the level 2 cache 126 from the main memory 120, the memory controller 140 could be the transmitting node, node X, and the level 2 cache 126 could be the receiving node, node Y.

In another example, communications in either direction between the processing element 132 and the level two cache 138 may be compressed for passage via the interconnect 136.

So, for any of these examples, compression and decompression circuitry can be provided at the following pairs of locations: (A, E), (B, C), (D, E).

The decompression apparatus is in one sense optional, given that where the recipient node is a memory or memory controller, the compressed data can be stored or otherwise handled in its compressed form. So, in some examples there is no need for a decompression circuitry to be used. In other examples, however, particularly in order to avoid having to implement significant changes to the circuitry or operation of the recipient node, a decompression apparatus 230 is indeed provided.

Note that in the context of the provision of compression and decompression apparatus, the term "processing node" can include the nodes 120, 130, 140, 150 and/or elements within a processing node such as the processing element 132 and the level 2 cache 138.

Various examples will now be considered, in order to explain the operation of the compression and decompression arrangements of the present disclosure.

As discussed in detail below, FIG. 2 therefore provides an example of data processing apparatus comprising: a first processing node 200; a second processing node 210; a data interconnection 224 between the first processing node and the second processing node; and data compression circuitry 220 to compress a set of data values to be transmitted via the data interconnection from the first processing node to the second processing node, the data compression circuitry comprising (as discussed below): detector circuitry to detect, for each of n complementary groups of m data values of the set of data values, a first subset of the groups for which the data values in the group have a predetermined pattern of data values, where m and n are integers and m×n is the number of data values in the set of data values; and generator circuitry to generate a compressed data packet comprising at least: a representation of a second subset of the groups, the second subset being each of the n complementary groups other than groups in the first subset; and an indication of a group position, with respect to the set of data values, of each group in the second subset of groups.

The apparatus of FIG. 2 may also optionally comprise data decompression circuitry 230 to process a compressed data packet received via the data interconnection from the first processing node and to generate a set of output data values to be provided to the second processing node, the compressed data packet comprising at least a representation of a subset of n complementary groups of m data values of a set of output data values, and an indication of a group position, with respect to the set of output data values, of each group in the subset of groups; the data decompression circuitry being configured to assemble the set of output data values by inserting the subset of groups at their respective group positions and setting other groups of data values of the set of output data values to the predetermined pattern of data values.

Figures 3, 4:
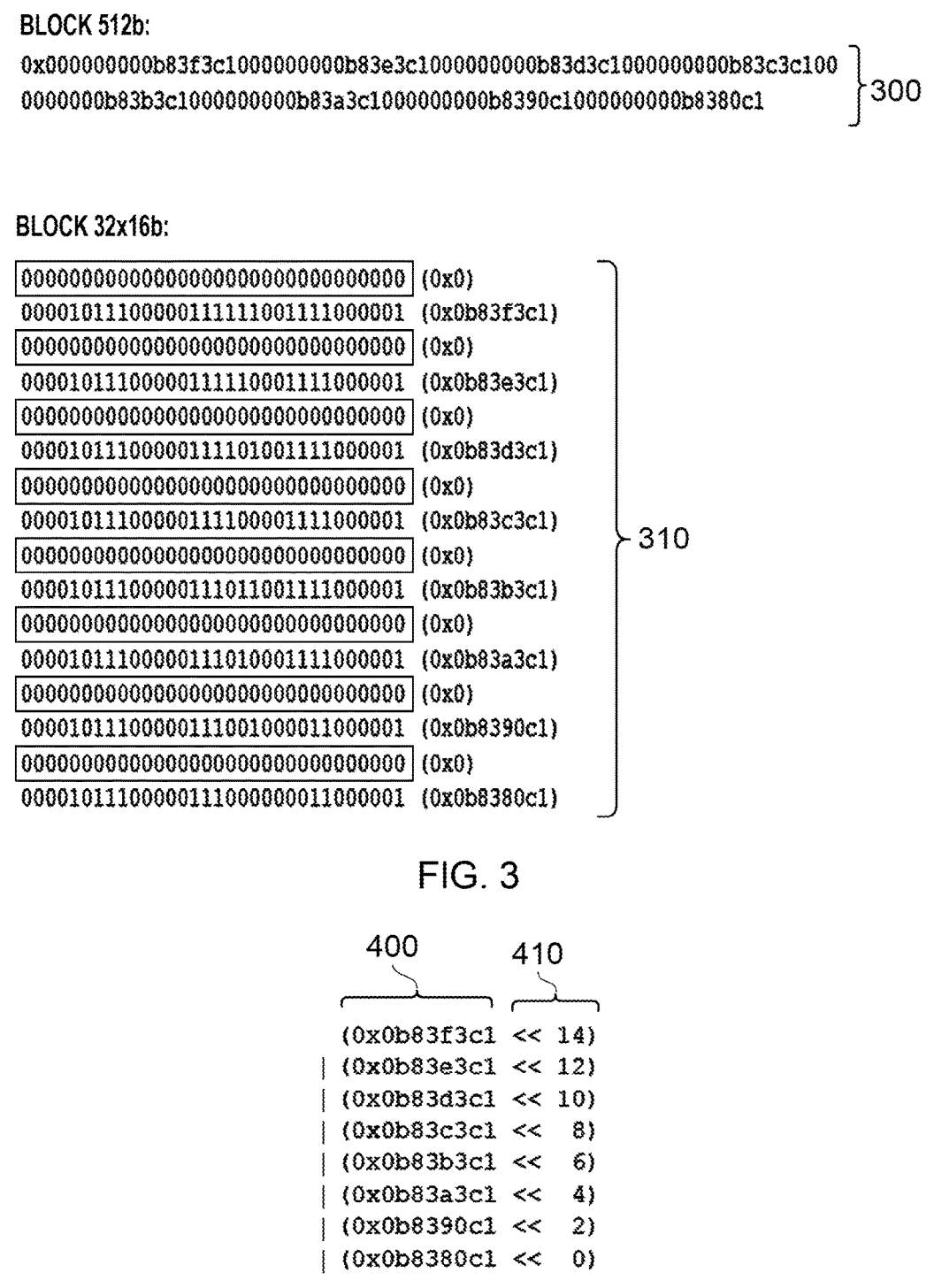

FIG. 3 schematically illustrates a data block 300 of (in this example) 512 data bits (512b). For clarity, the representation 300 is in a hexadecimal format.

In the context of data transmissions between processing nodes of the type discussed above, it may be the case that data blocks of this type can contain predetermined patterns such as all-zero patterns of 16, 32, 64, 128, 256 or 512 bits or data values, given that in some applications unused parts of a memory structure are zero-padded. In order to assist in visualising the location of such patterns, the block 300 is arranged in binary form in FIG. 3 as 16 rows 310 each of 32 bits. The rows are formed as successive groups of m contiguous bits of the block 300, where m is 32 in this example. There are n (16) such groups. m×n (16×32) is equal to the block size (512 bits). The arrangement into rows 310 is simply to assist in visualisation and is not necessarily a physical or logical requirement of the circuitry. It can be seen in FIG. 3 that alternate rows as drawn, forming a first subset of the rows or groups, are populated by all zero values. The other rows, forming a second subset of the rows or groups, are populated by various data values which are non-zero.

As discussed below, in the present technique, the all-zero rows of the first subset are not transmitted, given that these represent a predetermined pattern (for example all having a predetermined data value such as all zeroes) which can be reconstructed at the decompression apparatus. The other, second subset of rows are transmitted, as data values 400 (FIG. 4) forming a representation of those rows along with an indication 410 of the position of each row in the array of rows 310 of FIG. 3. The indication is provided as a shift (<<) indication of a number of row sizes within the block to be reconstructed, using an OR logical combination ("|") to combine with the all-zero initial population of the output pattern.

In the example of FIG. 4, the transmission of the rows value 400 requires 32×8 (256) bits and the transmission of the indication 410 requires 4×8=32 bits. This means that instead of transmitting 512 bits for the uncompressed block 300, 288 bits can in fact be transmitted.

In an example arrangement with a 64 bit bus width, the transmission of 512 bits would take 8 data "beats" or transmission instances, each of 64 bits, whereas the transmission of the 288 bits requires 5 such data beats.

Another example will now be described with reference to FIGS. 5 to 7.

In FIG. 5, a 512-bit block 500 is represented as 32 rows of 16 bits, drawn as two columns 510, 520 of 16 bit groups. Once again, it can be seen that sixteen of the 16 bit groups in the column 510 are all of a predetermined pattern, such as all-zero values. So, using the technique discussed above, the remaining 16 rows or groups in the column 520 can be transmitted as representations 600 (FIG. 6) each of 16 bits, along with indications 610 of the group position within the original block 500. Here, the indications 610 require 5 bits each in order to encode a position within a set of 32 rows, so that the total data amount in FIG. 6 is 16×16 bits for the representations 600 (256 bits) plus 16×5 bits=80 bits, or a total of 336 bits, compared to the 512 bits to transmit the whole block 500.

Figures 7A, 7B:
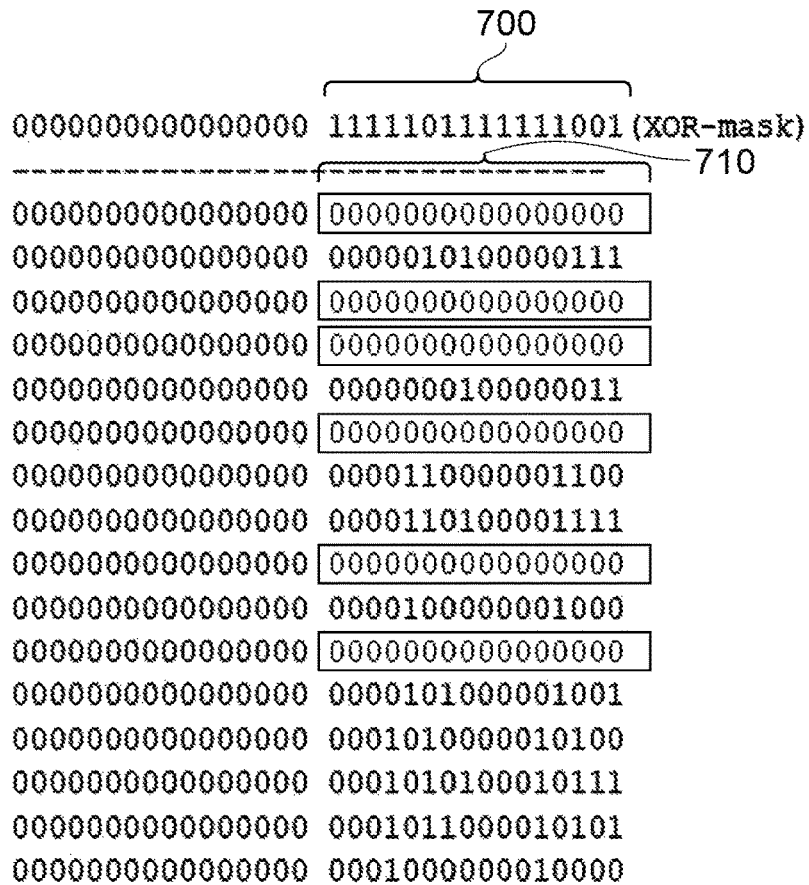

FIG. 7a schematically represents a technique allowing the data to be compressed even further by applying a mask or key using, for example, an exclusive OR (XOR) operation that has the effect of reversibly converting data bits with a value of 1 to 0. In some examples, this mask or key can be applied to rows or columns of bits as drawn. Other techniques for applying a mask are discussed below.

In FIG. 7a, a mask value or key group 700 is shown, along with the data in the right hand column 710 resulting from the bitwise XOR combination of the right hand column of FIG. 5 520 with the key data 700. It can be seen that several rows, which previously had non-zero values, now have all zeroes so that they do not need to be transmitted either. In fact, six rows of the right hand column no longer need to be transmitted, saving (16+5) bits for each such non-transmitted row, or a total saving of 126 bits by using the mask 700.

Note that in FIG. 7a, the groups are 16 bits long (m=16) but the XOR mask is 32 bits long (k=32). The XOR mask in this example is an integer multiple of the length of the groups, so that (in this example) two groups are covered by one instance of the mask, but this does not have to be the case. More generally, the XOR mask could simply be applied repeatedly through the input data. The XOR mask could be applied an integer number of times (if it is an integer divisor of the input data length) or could truncate early at a last instance of application if not. However, although all of these generalities are possible, a significant use of the XOR mask is to align with repeated patterns in the input data, just as the division into m×n blocks is also aiming to do this, so that in many practical example situations it is likely that the XOR mask would indeed be an integer multiple of m in length.

So, in general, there are n groups of m bits in the set of input data, and the k bit key value is applied contiguously to the set of input data. That is to say, starting at a particular location in the set of input data, the k-bit key is applied to k bits, then applied to a next k bits, then a next k bits and so on, so that all bits of the set of input data have a respective bit of the k-bit key group applied to them. As mentioned, in some cases, there will be a resonance such that m and k are related by an integer relationship, but this is not a requirement.

FIG. 7b schematically represents a compressed data block based on the input data of FIG. 7a. The compressed data block includes a representation of the XOR mask followed by the non-zero 16 bit rows of FIG. 7a.

Note that in some examples given below, a compressed data block may also provide format information defining, for example, a type of combination used (in place of XOR for example) and/or the variables m and n, but this is not shown in FIG. 7b for clarity of the diagram.

FIG. 8 schematically illustrates another example 800 of a data block and a visualisation 810 of the data block 800 visualised as 32 columns of 16 bits (or in other words, 16 instances of every $32^{nd}$ bit of the original group).

Figures 9, 10:
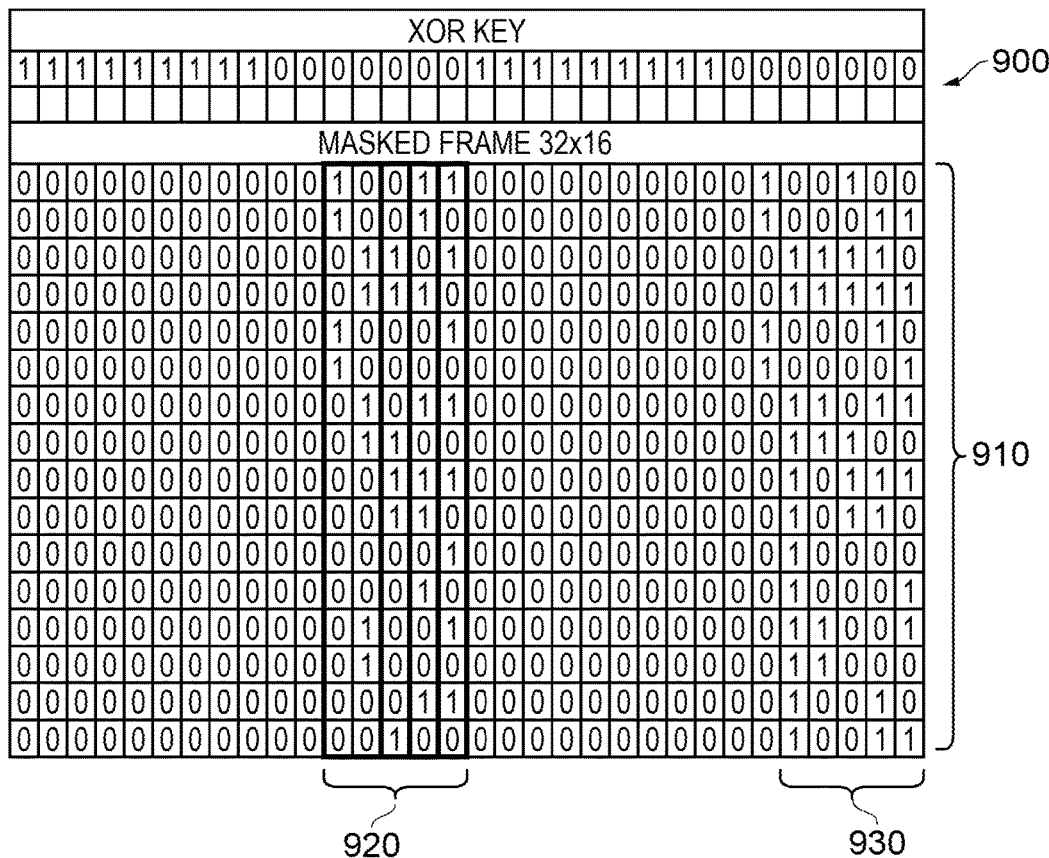
FIG. 9 schematically illustrates the processing of the data block of FIG. 8.
FIG. 10 schematically illustrates a compressed version of the data block of FIG. 8.

In FIG. 9, key data 900 is applied and combined with each row by an XOR operation so as to generate a processed set of data 910. This can then be encoded column-by column such that columns which are all-zero bits (representing the predetermined pattern) are not transmitted, but a representation of other columns such as the columns 920 and 930 is transmitted as data 1000 (FIG. 10) along with an indication 1010 of the column address within the data block.

FIGS. 11a-c schematically represent another example relating to an example commonly occurring pattern in a GPU memory read or in similar data blocks. Note that the pattern itself is merely an example; the discussion is about any such pattern which occurs commonly, for example in this type of data.

An example 512 bit data block 1180 is partitioned as discussed above into 16 rows 1185 of 32 bits (FIG. 11a). A common pattern is detected and used as a 32 bit XOR mask applied to each row. So here, m=k=32. This generates just four remaining non-zero rows, so that (FIG. 11c) the compressed data block simply needs to define the XOR key data and four 16-bit rows, a total of 336 bits.

Figure 12A:
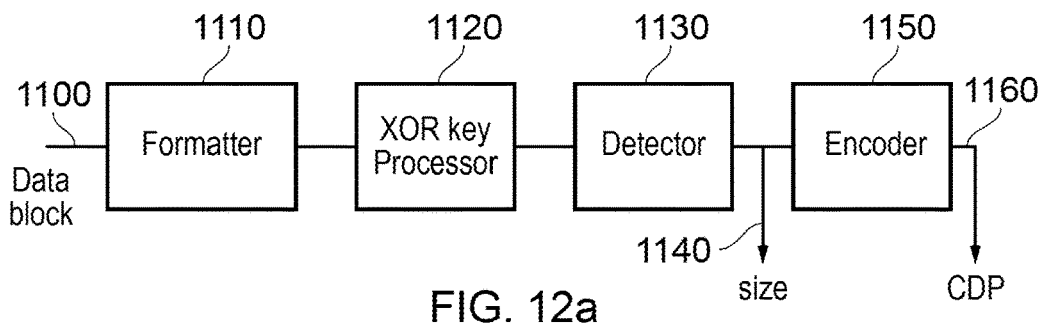
FIG. 12a schematically illustrates a data compression apparatus.

FIG. 12a schematically illustrates a data compression apparatus. A data block 1100 such as a 512 bit data block is provided to data formatting circuitry 1110 which, for example, formats the data as n complimentary groups of m data values, such as a set of rows or a set of columns as discussed above.

Key processing circuitry 1120 creates and applies an XOR key value to the formatted data groups, or at least to groups which are not already of the predetermined pattern such as all zeroes.

In order to generate a key value, the circuitry 1120 can detect bit positions of the groups where at least a threshold proportion of the groups have, for example, a value of 1 at that bit position. For any bit positions which meet the threshold proportion, a 1 is applied to that bit position of the X or key value. For example, the threshold proportion can in fact be a threshold such that all groups have to have a 1 at that bit position.

The XOR key is then applied by an XOR operation to each of the groups.

A detector 1130 detects rows or columns (groups) resulting from the key processing which have all-zero values (the predetermined pattern). These are allocated to a first subset of groups and do not need to be explicitly encoded. Other groups are allocated to a second subset which will require encoding. This results in an indication 1140 of the size of encoded data, namely the number of groups in the second subset multiplied by the groups size in bits, plus the number of groups in the second subset multiplied by the number of bits required to encode a group location ($\log_2$(number of groups)), plus (if the key value is being sent) the number of bits of the key value. Finally, an encoder 1150 encodes a compressed data packet (CDP) 1160 indicating the second subset of groups and their respective group locations. The CDP may also include the XOR key value generated by the circuitry 1120.

FIG. 12a therefore provides an example of apparatus comprising: data compression circuitry to process a set of data values, the data compression circuitry comprising: detector circuitry 1130 to detect, for each of n complementary groups of m data values of the set of data values, a first subset of the groups for which the data values in the group have a predetermined pattern of data values, where m and n are integers and m×n is the number of data values in the set of data values; and generator circuitry 1150 to generate a compressed data packet comprising at least: a representation of a second subset of the groups, the second subset being each of the n complementary groups other than groups in the first subset; and an indication of a group position, with respect to the set of data values, of each group in the second subset of groups.

Figure 12B:
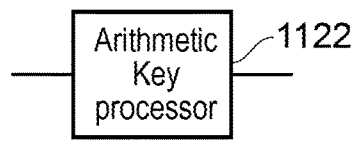
FIG. 12b schematically illustrates a key processor.

FIG. 12b schematically illustrates, as an alternative to the XOR key processor 1120, an arithmetic key processor 1122. This can operate in a similar manner to the XOR key processor 1120 to increase the number of groups having the predetermined pattern, by applying (adding or subtracting) a multi-bit arithmetic key value which can then be subtracted or added back (respectively) at the decompression side. For example, the arithmetic key processor 1122 could generate the key value as a negation of a most commonly occurring group value.

The key processors 1120, 1122 provide examples (where the data values comprise respective data bits) in which the data compression circuitry comprises combiner circuitry 1120, 1122 to combine each group of m data values with bits of an k-bit key group applied contiguously to the set of data values to generate a respective combined group, the detector circuitry operating with respect to the combined groups. For example, the combiner circuitry may be configured to apply a combination selected from the list consisting of: (i) a bitwise exclusive-OR combination to each group of m data values and bits of the k-bit key group; and (ii) an arithmetic combination of each group of m data values and bits of the k-bit key group. The combiner circuitry 1120, 1122 can be configured to generate the k-bit key group. In the case of an XOR combination, the combiner circuitry can be configured to set each bit position of the coding value to one when at least a threshold proportion of instances of the m-bit groups have a one at that bit position. Note that the combination can be with one set of groups (rows/columns) but the encoding can be according to another set of groups (columns/rows) as shown in the example of FIGS. 9 and 10.

Figure 13:
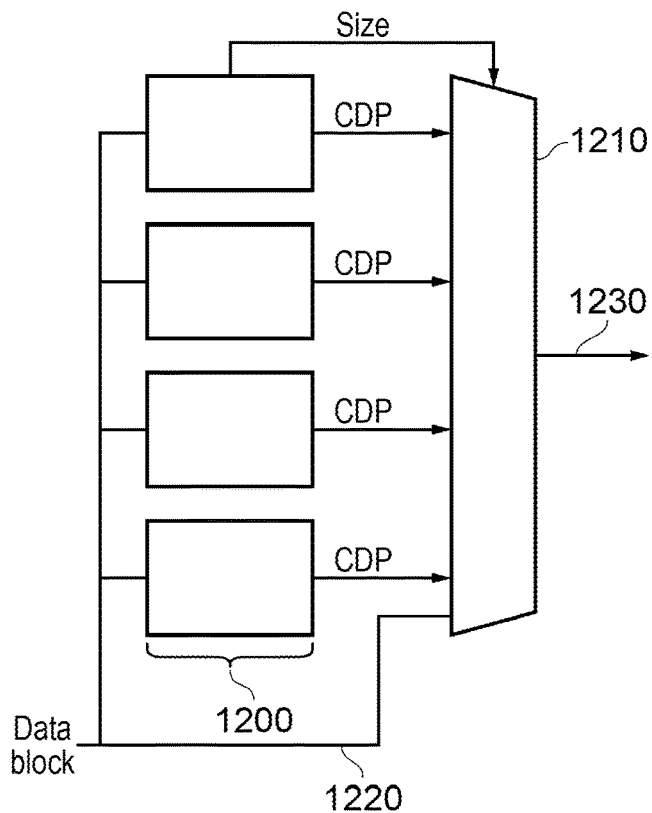
FIG. 13 schematically illustrates a data compression apparatus.

The arrangements of FIGS. 11a and 11b relate to the technique discussed here as applied to one particular format (a format defining the values m, n, the type of groups (whether m contiguous data values or every nth data value are used) and the like. In fact, multiple formats can be treated in this way using circuitry as shown in FIG. 13, comprising multiple instances 1200 of the circuitry of FIG. 11 and output circuitry such as a multiplexer 1210 arranged to select one of the CDPs 1160 generated by the instances 1200 or the uncompressed (raw) data block 1220, on the basis of the size indications 1140 from each of the instances 1200. The output circuitry 1210 may, for example, select one of the compressed data packets or the raw data in dependence upon which of the raw data and the compressed data packets represents a smaller amount of output data 1230.

The output circuitry 1210 provides an example of output circuitry to output either the set of data values or the compressed data packet, in dependence upon which of the set of data values and the compressed data packet represents a smaller amount of data.

Therefore, FIG. 13 provides an example in which two or more instances of data compression circuitry 1200 are used, to perform data compression to generate respective compressed data packets using: groups of m contiguous data values of the set of data values; and groups of every nth data value of the set of data values; and in which: the output circuitry 1210 is configured to output either the set of data values or one of the compressed data packets, in dependence upon which of the set of data values and the compressed data packets represents a smaller amount of data. In FIG. 13, at least four instances of data compression circuitry may be used, to perform data compression to generate respective compressed data packets using: (i) groups of m contiguous data values of the set of data values for a first value of m; (ii) groups of every nth data value of the set of data values for a first value of n; (iii) groups of m contiguous data values of the set of data values for a second value of m; and (iv) groups of every nth data value of the set of data values for a second value of n.

The trial encoding arrangements of FIG. 13 can be extended to trials of different key lengths k, for example including m, 2 m, 0.5 m and the like as candidate values of k.

Figure 14:
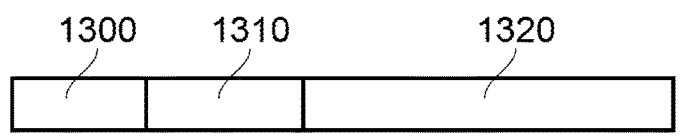
FIG. 14 schematically illustrates a compressed data packet.

FIG. 14 schematically illustrates an example data packet comprising format data 1300 indicating values for m, n and the type of group (n contiguous data values or every nth data value) used, an XOR or arithmetic key value 1310 and payload data 1320 comprising representations of the second subset of groups and for each such representation of a group position. The field 1310 provides an example in which the compressed data packet includes a representation of the k-bit key group.

Therefore, in these examples, the compressed data packet of FIG. 14 has associated format data 1300 defining a compression format indicating at least whether the groups of m data values each comprise: groups of m contiguous data values of the set of data values; or groups of every nth data value of the set of data values. Generally, the format data may indicate the groups used in the generation of that data packet and whether first or second values of m and n were used.

Figures 15, 16A:
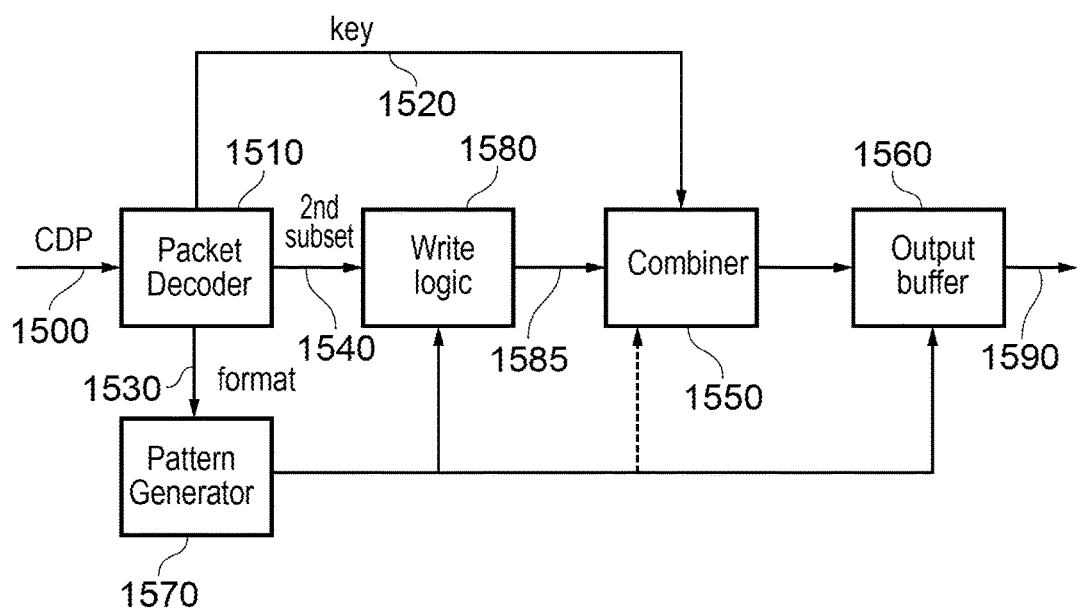
FIG. 15 schematically illustrates a set of options for use with the apparatus of FIG. 13.
FIG. 16a schematically illustrates a data decompression apparatus.

FIG. 15 schematically illustrates a set of options for use with FIG. 13, in which various values 1400 of n, m are provided and either row or column compression is used (representing groups of m contiguous data values or groups of every nth data value respectively) with or without the use of a key as discussed above each of these can be handled by an instance 1200 in FIG. 13 and one of them, or the raw data, selected in dependence on which gives the lowest amount of data to be transmitted.

In FIG. 15, the first value of m is equal to the second value of n; and the second value of m is equal to the first value of n (for example, 16; 32).

FIG. 16a schematically illustrates a data decompression apparatus in which a compressed data packet 1500 is received by a packet decoder or parser 1510 which outputs the key data 1520, format data 1530 indicating m, n and the type of group used, and the representations of groups in the second subset 1540 along with their position indications.

An output buffer 1560 is initially populated with the predetermined pattern (such as all zeroes) according to the format defined by the format data 1530 by a pattern generator 1570, and then write logic 1580 generates representations 1585 of the second subset of groups for writing to group positions defined by the associated position data in the output buffer, again making use of the format data to indicate the type of groups in use.

The key data 1520 is combined with the representations 1585 by a combiner 1550 and the results are written to the output buffer 1560. In the case of the compression apparatus using a bitwise XOR combination, the combiner 1550 also uses a bitwise XOR combination. In the case of an arithmetic key, the combiner 1550 uses an arithmetic combination.

In example arrangements, either the key data is combined with all of the array of data including the pre-populated zeroes generated by the output buffer and indicated by a broken-line path to the combiner 1550) or the output buffer can be pre-populated with multiple instances of data dependent upon the key data (such as the key value itself, in the case of an XOR mask) and then overwritten for eth second subset only via the combiner.

The decompressed data 1590 is then ready for output by the output buffer 1560.

FIG. 16a therefore provides an example of apparatus comprising:

data decompression circuitry 1510, 1550 to process a compressed data packet to generate a set of output data values, the compressed data packet comprising at least a representation of a subset of n complementary groups of m data values of a set of output data values, and an indication of a group position, with respect to the set of output data values, of each group in the subset of groups; and the data decompression circuitry (1580, 1560, 1570) being configured to assemble the set of output data values by inserting the subset of groups at their respective group positions and setting other groups of data values of the set of output data values to a predetermined pattern of data values.

Figure 16B:
FIG. 16b schematically illustrates an output buffer.

FIG. 16b schematically illustrates the output buffer 1560, in an example where a row-wise encoding is being used. Initially the pattern generator 1570 populates rows of data 1595 in the output buffer with all zeroes (or whatever the predetermined pattern is), then the write logic writes rows of data into certain ones of the rows 1595 according to the indications associated with the received row data.

The process discussed above to select a compression format involves multiple trial compressions. Once this has been performed for a particular data block, it remains a property of that data block that this will be the best compression format to use in respect of that data block, as long as the data block remains unchanged.

Figure 17:
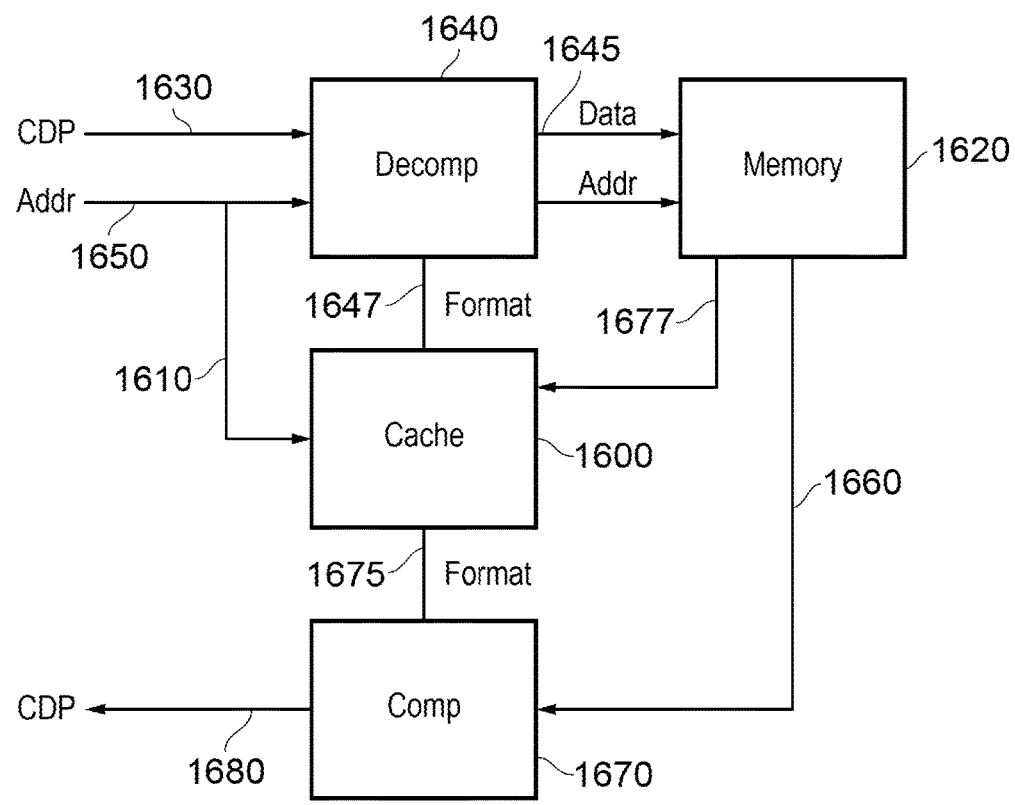
FIG. 17 schematically illustrates a data decompression apparatus.

Referring to FIG. 17, which schematically illustrates a decompression apparatus, the format data for a received encoded data block can be stored by a cache 1600, for example in association with a memory address 1650 used for storage of the decompressed data in a memory 1620 such as the main memory 120 of FIG. 1. So, the compressed data packet 1630 is received and processed by decompression apparatus 1640 of the type shown in FIG. 16a, leading to the generation of decompressed data 1645 and the output to the cache 1600 of the format data 1647 from the packet decoder 1510 of FIG. 16a. Address information 1650 relating to the data handling operation for which the data is being transmitted is used to identify a location in the cache 1600 at which the format data 1647 is temporarily stored. The data 1645 is then stored to the memory 1620 on the basis of the address 1650.

Therefore, the apparatus of FIG. 17 comprises a data store or cache 1600 to store the format data 1647 associated with a received compressed data packet.

Subsequently, when the same data block is to be transmitted elsewhere, either back to the original sending node or to another node, the data block is read from memory as data 1660 and provided to compression apparatus 1670. Here, only one instance of the compression apparatus of FIG. 11 needs to be used, because it can operate on the basis of format data 1675 read from the cache 1600 according to the address 1677 of the data just read from the memory 1620. The compression apparatus 1670 applies the cached format to compress the data 1660 to generate an output compressed data packet 1680 for onward transmission, without the need for multiple trial encodings.

The circuitry 1670 (as an instance of FIG. 11) provides an example of data compression circuitry to process a set of data values, the data compression circuitry comprising: detector circuitry to detect, for each of n complementary groups of m data values of the set of data values, a first subset of the groups for which all of the data values in the group have a predetermined pattern of data values, where m and n are integers and m×n is the number of data values in the set of data values; generator circuitry to generate a compressed data packet comprising at least: a representation of a second subset of the groups, the second subset being each of the n complementary groups other than groups in the first subset; and an indication of a group position, with respect to the set of data values, of each group in the second subset of groups; in which, when the set of data values has been previously decompressed by the apparatus, the detector circuitry is configured to operate with respect to groups of m data values defined by the format data 1675 held by the data store 1600 in respect of the previous decompression of that set of data values.

Figure 18:
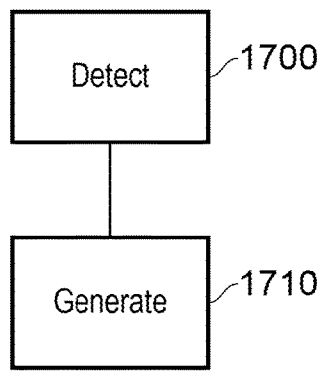
FIGS. 18 and 19 are schematic flowcharts illustrating respective methods.

FIG. 18 is a schematic flowchart illustrating a data compression method comprising:
- detecting (at a step 1700), for each of n complementary groups of m data values of the set of data values, a first subset of the groups for which all of the data values in the group have a predetermined pattern of data values, where m and n are integers and m×n is the number of data values in the set of data values; and
- generating (at a step 1710) a compressed data packet comprising at least:
- a representation of a second subset of the groups, the second subset being each of the n complementary groups other than groups in the first subset; and
- an indication of a group position, with respect to the set of data values, of each group in the second subset of groups.

Figure 19:
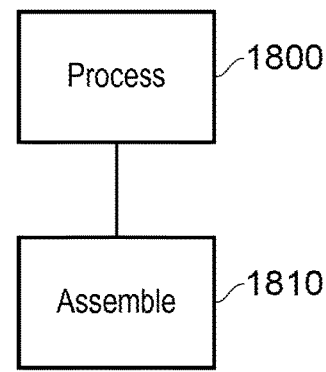

FIG. 19 is a schematic flowchart illustrating a data decompression method comprising:
- processing (at a step 1800) a compressed data packet to generate a set of output data values, the compressed data packet comprising at least a representation of a subset of n complementary groups of m data values of a set of output data values, and an indication of a group position, with respect to the set of output data values, of each group in the subset of groups; and
- assembling (at a step 1810) the set of output data values by inserting the subset of groups at their respective group positions and setting other groups of data values to a predetermined pattern of data values.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function, in which case software or program instructions by which the function is performed, and a providing medium such as a non-transitory machine-readable medium by which such software or program instructions are provided (for example, stored) are considered to represent embodiments of the disclosure. "Configured to" does not imply that the apparatus element needs to be changed in any way in order to provide the defined operation.

Although illustrative embodiments of the present techniques have been described in detail herein with reference to the accompanying drawings, it is to be understood that the present techniques are not limited to those precise embodiments, and that various changes, additions and modifications can be effected therein by one skilled in the art without departing from the scope and spirit of the techniques as defined by the appended claims. For example, various combinations of the features of the dependent claims could be made with the features of the independent claims without departing from the scope of the present techniques.

The invention claimed is:

1. Apparatus comprising:
   data compression circuitry to process a set of data values, the data compression circuitry comprising:
   detector circuitry to detect, for each of n complementary groups of m data values of the set of data values, a first subset of the groups for which the data values in the group have a predetermined pattern of data values, in which the predetermined pattern comprises all data values in the group having a predetermined data value, where m and n are integers and m×n is the number of data values in the set of data values; and
   generator circuitry to generate a compressed data packet comprising at least:
   a representation of a second subset of the groups, the second subset being each of the n complementary groups other than groups in the first subset; and
   an indication of a group position, with respect to the set of data values, of each group in the second subset of groups.

2. Apparatus according to claim 1, comprising:
   output circuitry to output either the set of data values or the compressed data packet, in dependence upon which of the set of data values and the compressed data packet represents a smaller amount of data.

3. Apparatus according to claim 2, in which the groups of data values comprise:
   groups of m contiguous data values of the set of data values; or
   groups of every nth data value of the set of data values.

4. Apparatus according to claim 2, in which:
   the data values comprise respective data bits; and
   the data compression circuitry comprises combiner circuitry to combine each group of m data values with bits of an k-bit key group applied contiguously to the set of data values to generate a respective combined group, the detector circuitry operating with respect to the combined groups.

5. Apparatus according to claim 4, in which the combiner circuitry is configured to apply a combination selected from the list consisting of:
(i) a bitwise exclusive-OR combination to each group of m data values and bits of the k-bit key group; and
(ii) an arithmetic combination of each group of m data values and bits of the k-bit key group.

6. Apparatus according to claim 4, in which the compressed data packet includes a representation of the k-bit key group.

7. Apparatus according to claim 5, in which the combiner circuitry is configured to generate the k-bit key group.

8. Apparatus according to claim 7, in which, for a bitwise exclusive-OR combination, the combiner circuitry is configured to set each bit position of the coding value to one when at least a threshold proportion of instances of the m-bit groups have a one at that bit position.

9. Apparatus according to claim 8, comprising two or more instances of data compression circuitry, to perform data compression to generate respective compressed data packets using:
groups of m contiguous data values of the set of data values; and
groups of every nth data value of the set of data values; and in which:
the output circuitry is configured to output either the set of data values or one of the compressed data packets, in dependence upon which of the set of data values and the compressed data packets represents a smaller amount of data.

10. Apparatus according to claim 9, comprising at least four instances of data compression circuitry, to perform data compression to generate respective compressed data packets using:
(i) groups of m contiguous data values of the set of data values for a first value of m;
(ii) groups of every nth data value of the set of data values for a first value of n;
(iii) groups of m contiguous data values of the set of data values for a second value of m; and
(iv) groups of every nth data value of the set of data values for a second value of n.

11. Apparatus according to claim 10, in which the first value of m is equal to the second value of n; and the second value of m is equal to the first value of n.

12. Apparatus according to claim 10, in which each compressed data packet includes format data indicating the groups used in the generation of that data packet and whether the first or second values of m and n were used.

13. Data processing apparatus comprising:
a first processing node;
a second processing node;
a data interconnection between the first processing node and the second processing node; and
data compression circuitry to compress a set of data values to be transmitted via the data interconnection from the first processing node to the second processing node, the data compression circuitry comprising:
detector circuitry to detect, for each of n complementary groups of m data values of the set of data values, a first subset of the groups for which the data values in the group have a predetermined pattern of data values, where m and n are integers and m×n is the number of data values in the set of data values; and
generator circuitry to generate a compressed data packet comprising at least:
a representation of a second subset of the groups, the second subset being each of the n complementary groups other than groups in the first subset; and
an indication of a group position, with respect to the set of data values, of each group in the second subset of groups.

14. Data processing apparatus according to claim 13, comprising:
data decompression circuitry to process a compressed data packet received via the data interconnection from the first processing node and to generate a set of output data values to be provided to the second processing node, the compressed data packet comprising at least a representation of a subset of n complementary groups of m data values of a set of output data values, and an indication of a group position, with respect to the set of output data values, of each group in the subset of groups;
the data decompression circuitry being configured to assemble the set of output data values by inserting the subset of groups at their respective group positions and setting other groups of data values of the set of output data values to the predetermined pattern of data values.

15. Apparatus comprising:
data decompression circuitry to process a compressed data packet to generate a set of output data values, the compressed data packet comprising at least a representation of a subset of n complementary groups of m data values of a set of output data values, and an indication of a group position, with respect to the set of output data values, of each group in the subset of groups; and
the data decompression circuitry being configured to assemble the set of output data values by inserting the subset of groups at their respective group positions and setting other groups of data values of the set of output data values to a predetermined pattern of data values.

16. Apparatus according to claim 15, in which the compressed data packet has associated format data defining a compression format indicating at least whether the groups of m data values each comprise:
groups of m contiguous data values of the set of data values; or
groups of every nth data value of the set of data values;
the apparatus comprising a data store to store the format data associated with a received compressed data packet.

17. Apparatus according to claim 16, comprising:
data compression circuitry to process a set of data values, the data compression circuitry comprising:
detector circuitry to detect, for each of n complementary groups of m data values of the set of data values, a first subset of the groups for which all of the data values in the group have a predetermined pattern of data values, where m and n are integers and m×n is the number of data values in the set of data values;
generator circuitry to generate a compressed data packet comprising at least:
a representation of a second subset of the groups, the second subset being each of the n complementary groups other than groups in the first subset; and
an indication of a group position, with respect to the set of data values, of each group in the second subset of groups;
in which, when the set of data values has been previously decompressed by the apparatus, the detector circuitry is configured to operate with respect to groups of m data values defined by the format data held by the data store in respect of the previous decompression of that set of data values.

18. A data compression method comprising:

detecting, for each of n complementary groups of m data values of the set of data values, a first subset of the groups for which all of the data values in the group have a predetermined pattern of data values, in which the predetermined pattern comprises all data values in the group having a predetermined data value, where m and n are integers and m×n is the number of data values in the set of data values; and generating a compressed data packet comprising at least:

a representation of a second subset of the groups, the second subset being each of the n complementary groups other than groups in the first subset; and an indication of a group position, with respect to the set of data values, of each group in the second subset of groups.

19. A data decompression method comprising:

processing a compressed data packet to generate a set of output data values, the compressed data packet comprising at least a representation of a subset of n complementary groups of m data values of a set of output data values, and an indication of a group position, with respect to the set of output data values, of each group in the subset of groups; and assembling the set of output data values by inserting the subset of groups at their respective group positions and setting other groups of data values to a predetermined pattern of data values.

* * * * *